United States Patent
Kelly et al.

(10) Patent No.: US 6,463,565 B1
(45) Date of Patent: Oct. 8, 2002

(54) METHOD FOR DESIGNING OBJECT-ORIENTED TABLE DRIVEN STATE MACHINES

(75) Inventors: Keith C. Kelly, Deerfield Beach; Mark A. Pietras; Michael Kelly, both of Boca Raton, all of FL (US)

(73) Assignee: NetSpeak Corporation, Boca Raton, FL (US)

( * ) Notice: Subject to any disclaimer, the term of this patent is extended or adjusted under 35 U.S.C. 154(b) by 0 days.

(21) Appl. No.: 09/477,435

(22) Filed: Jan. 4, 2000

Related U.S. Application Data

(60) Provisional application No. 60/114,752, filed on Jan. 5, 1999.

(51) Int. Cl.[7] .............................................. G06F 17/50
(52) U.S. Cl. .............................. 716/1; 716/16; 716/17
(58) Field of Search ........................... 716/1, 4, 16, 17, 716/18, 5, 2, 7; 326/39, 46

(56) References Cited

U.S. PATENT DOCUMENTS

| | | | |
|---|---|---|---|
| 5,473,531 A | * | 12/1995 | Flora-Holmquist et al. ... 700/12 |
| 5,517,432 A | * | 5/1996 | Chandra et al. ................ 716/5 |
| 6,055,594 A | * | 4/2000 | Lo et al. ......................... 326/46 |
| 6,198,303 B1 | * | 3/2001 | Rangasayee .................. 326/38 |
| 6,212,625 B1 | * | 4/2001 | Russell ......................... 716/16 |

* cited by examiner

Primary Examiner—Matthew Smith
Assistant Examiner—Pavel Dinh
(74) Attorney, Agent, or Firm—Kenyon & Kenyon

(57) ABSTRACT

A finite state machine is implemented by encapsulating the portions of a state table, which are associated with each state in a state object. Each state object is instantiated when the associated state is entered and destroyed when the state is exited. Since memory is only allocated at runtime when an object is instantiated and in existence, the amount of memory required to implement the state table is minimized. The state class from which the state object is instantiated can be subclassed. In accordance with normal object-oriented class design, a subclass inherits the state table of its parent class. However, the subclass allows table rows to be added and table rows present in the parent class to be overwritten in the subclass. The state table in each state class includes methods that are called when the class is created and destroyed.

40 Claims, 11 Drawing Sheets

| STATE | EVENT | ACTION | NEXT STATE |
|---|---|---|---|
| State_1 | Event_1 | Function_One() | State_2 |
| State_1 | Event_2 | | State_1 |
| State_1 | Event_3 | | State_1 |
| State_1 | Event_4 | | State_1 |
| State_1 | Event_5 | | State_1 |
| State_2 | Event_1 | | State_2 |
| State_2 | Event_2 | Function_Two() | State_3 |
| State_2 | Event_3 | | State_2 |
| State_2 | Event_4 | | State_2 |
| State_2 | Event_5 | | State_2 |
| State_3 | Event_1 | | State_3 |
| State_3 | Event_2 | | State_3 |
| State_3 | Event_3 | Function_Three() | State_4 |
| State_3 | Event_4 | | State_3 |
| State_3 | Event_5 | Function_Five() | State_1 |
| State_4 | Event_1 | Function_report_error() | State_4 |
| State_4 | Event_2 | Function_report_error() | State_4 |
| State_4 | Event_3 | Function_report_error() | State_4 |
| State_4 | Event_4 | Function_Four() | State_1 |
| State_4 | Event_5 | Function_report_error() | State_4 |

*FIG. 3 (PRIOR ART)*

| STATE | EVENT | ACTION | NEXT STATE |
|---|---|---|---|
| State_1 | Init_Event | Function_State_1_Init() | State_1 |
| State_1 | Event_1 | Function_One() | State_2 |
| State_1 | Event_2 | | State_1 |
| State_1 | Event_3 | | State_1 |
| State_1 | Event_4 | | State_1 |
| State_1 | Event_5 | | State_1 |
| State_1 | Term_Event | | |

*FIG. 6*

| STATE | EVENT | ACTION | NEXT STATE |
|---|---|---|---|
| State_1 | Event_1 | Function_NewOne() | State_2 |
| State_1 | Event_2 | Function_NewTwo() | State_1 |
| State_1 | Event_6 | Function_Six() | State_6 |
| State_1 | Event_7 | Function_report_error() | State_1 |

| EVENT | ACTION | NEXT STATE |
|---|---|---|
| Event_1 | Function_NewOne() | State_2 |
| Event_2 | Function_NewTwo() | State_1 |
| Event_6 | Function_Six() | State_6 |
| Event_7 | Function_report_error() | State_1 |

| STATE | EVENT | ACTION | NEXT STATE |
|---|---|---|---|
| State_1 | Init_Event | Function_State_1_Init() | State_1 |
| State_1 | Event_1 | Function_NewOne() | State_2 |
| State_1 | Event_2 | Function_NewTwo() | State_1 |
| State_1 | Event_3 | | State_1 |
| State_1 | Event_4 | | State_1 |
| State_1 | Event_5 | | State_1 |
| State_1 | Event_6 | Function_Six() | State_6 |
| State_1 | Event_7 | Function_report_error() | State_1 |
| State_1 | Term_Event | | |

| STATE | EVENT | ACTION | NEXT STATE |
|---|---|---|---|
| Idle | Init_Event | Function_Authenticate_Terminal() | |
| Idle | Off_Hook_Event | | Setup_Call |
| Idle | Term_Event | | |

| STATE | EVENT | ACTION | NEXT STATE |
|---|---|---|---|
| Setup_Call | Init_Event | Function_Select_Protocal (Send DT Event) | |
| Setup_Call | Setup_Complete | Function_Send_Dial_Tone() | Call_in_Progress |
| Setup_Call | Term_Event | Function_Off Hook Term() | |

1202 — 
1204 — 
1206 —

METHOD FOR DESIGNING OBJECT-ORIENTED TABLE DRIVEN STATE MACHINES

RELATED APPLICATIONS

This application claims priority of U.S. provisional application Ser. No. 60/114,752, entitled METHOD FOR DESIGNING OBJECT-ORIENTED TABLE DRIVEN STATE MACHINES, filed on Jan. 5, 1999 by Keith C. Kelly, Mark Pietras and Michael Kelly.

FIELD OF THE INVENTION

This invention relates to methods and apparatus for designing state machines using tables and object-oriented programming techniques.

BACKGROUND OF THE INVENTION

Finite state machines are logical systems in which the sequential logic that implements the system has only a fixed number of possible states. When the system is in a given state, it may perform various predefined operations, such as displaying images or calculating results. The logic causes the system to advance from state to state causing the system to sequentially perform various operations. More specifically, when the logic is in a given state, the output and next sequential state are determined by a combinatorial function of the input to the logic and the present state of the logic. State machine approaches are typically utilized when designing and implementing protocols, user interfaces and complex systems involving asynchronous events, and solving other complex problems.

There are many methods for describing the behavior of finite state machines so that the implementing logic can be designed. These methods include abstract state machine notation, state diagrams, state tables, and hardware description languages. FIG. 1 illustrates a very simple state diagram that has four states 100, 102, 104 and 106. When the system is in each of these states, events that are represented by arrows can occur which move the system from one state to another. For example, in the diagram, the initial state 100 is assumed to be "State 1". An event called "Event 1" and represented by arrow 108 causes the logic to advance to a new state 102 called "State 2." The occurrence of another event called "Event 2" and represented by arrow 110 results in the logic moving to another state 104 called "State 3." From "State 3", 104, an "Event 3" or an "Event 5" are possible. The occurrence of "Event 5", represented by arrow 114, results in the system returning to its original state 100, that is "State 1." Alternatively, the occurrence of "Event 3", represented by arrow 112, causes the system to advance to a new state 106, called "State 4." While the system is in "State 4", 106, the occurrences of "Event 1", "Event 2", "Event 3", and "Event 5" do not change the system state as indicated by arrow 116. However, another response, such as an error condition may be raised in response to these events. Finally if an event called "Event 4" occurs while the system is in state 106, the system will advance as represented by arrow 118 back to State 1,100.

When state tables are used to describe the logic behavior, the underlying logic is said to be "table driven." In the communications area, table driven state machines have been used to graphically represent a solution to a communication problem. From the table, the underlying logic can be implemented quickly, often by programming teams. The is particularly true when a state machine is implemented in software. The use of tables also has the added advantage that future changes are relatively easy to implement, and the incidence of possible regressions is reduced or, at least, contained.

An example of a state table is illustrated in FIG. 2 that shows a state table that implements a finite state machine illustrated by the state diagram of FIG. 1. The table has four columns 200, 202, 204 and 206 that represent the current state, an event that occurs, the action taken when the event occurs and the resulting state of the system (which may be the current state), respectively. Each row, such as row 208, represents a particular state and event combination represented by the first two columns 210 and the results which occur represented by the last two columns, 212. As shown in FIG. 2, rows 208 and 214, the system changes from "State 1" and "State 2" only if event 1 or event 2 occurs as appropriate. As shown by rows 216 and 218, The system can advance from "State 3" to two different states if either of events 3 or 5 occur. "State 4" advances only if event 4 occurs, but events 1,2,3, and 5 result in an error being reported, and the system remains in the current state—"State 4."

A state table can be directly implemented in software by reproducing the state table in memory and using the current state and an event occurrence as inputs to perform a table lookup. Utilizing this table approach, the behavior of the implementing software becomes more readily apparent. As an example, if the system functionality must be extended at a later date, additional states, events, or functions may be added, and the implications easily understood. This easy expandability allows the system to be readily grown and reduces the exposure to regression. Another advantage of this approach is that the interaction of each of the functions is easily evaluated. Consequently, each of the functions (which normally require the most significant coding effort) can be assigned to a different programmer without requiring extensive coordination.

The problem with implementing the state table as a table lookup in memory is the additional memory required by the table. For large state tables, the amount of memory can be significant. In many cases, the benefits of this approach may outweigh the extra memory required, but in embedded systems, memory may have a more significant expense associated with it, and thus not justify this benefit.

The state table illustrated in FIG. 2 may also be implemented in a more complete form 300 illustrated in FIG. 3. This table is similar to the table illustrated in FIG. 2 except that it has a row representing each possible state and each possible event. For example, State__1 has a row representing each of events Event__1 to Event__5, represented by rows 302–310, respectively. If an event cannot occur in a particular state the Action column 301 is left blank and the NEXT STATE 303 remains the current state. Similarly State 2 has rows 312–320 representing Event__1 to Event__5 and State__3 has rows 322–330 representing Event__1 to Event__5. State__4 has rows 332–340 representing Event__1 to Event__5. A complete matrix like the one illustrated in FIG. 3 forces the implementers to consider the impact of events that are not anticipated, but even more memory is required to implement the table.

Therefore, it is desirable to provide the advantages of a finite state machine implemented with a state table while reducing the amount of memory used in such an implementation as much as possible.

SUMMARY OF THE INVENTION

In accordance with the principles of the invention, a finite state machine is implemented by encapsulating the portions of a state table, which are associated with each state in a state object. Each state object is instantiated when the associated state is entered and destroyed when the state is exited. Since memory is only allocated at runtime when an object is instantiated and in existence, the amount of memory required to implement the state table is minimized.

In accordance with one embodiment, the state class from which the state object is instantiated can be subclassed. In accordance with normal object-oriented class design, a subclass inherits the state table of its parent class. However, the subclass allows table rows to be added and table rows present in the parent class to be overwritten in the subclass.

In accordance with another embodiment, state table in each state class includes methods that are called when the class is created and destroyed.

BRIEF DESCRIPTION OF THE DRAWINGS

The above and further advantages of the invention may be better understood by referring to the following description in conjunction with the accompanying drawings in which:

FIG. 3 is a conventional state table which is a more complete version of the state table shown in FIG. 2.

FIG. 6 is a state table that is encapsulated in a state object representing state 1 of the four-state process illustrated in FIG. 1.

FIG. 8 is a composite table formed when the state table in FIG. 7 overrides the state table in FIG. 6.

FIG. 11 is an illustrative state table for an "Idle" state in a telecommunications example.

FIG. 12 is an illustrative state table for an "Setup Call" state in a telecommunications example.

DETAILED DESCRIPTION

Figure 4:
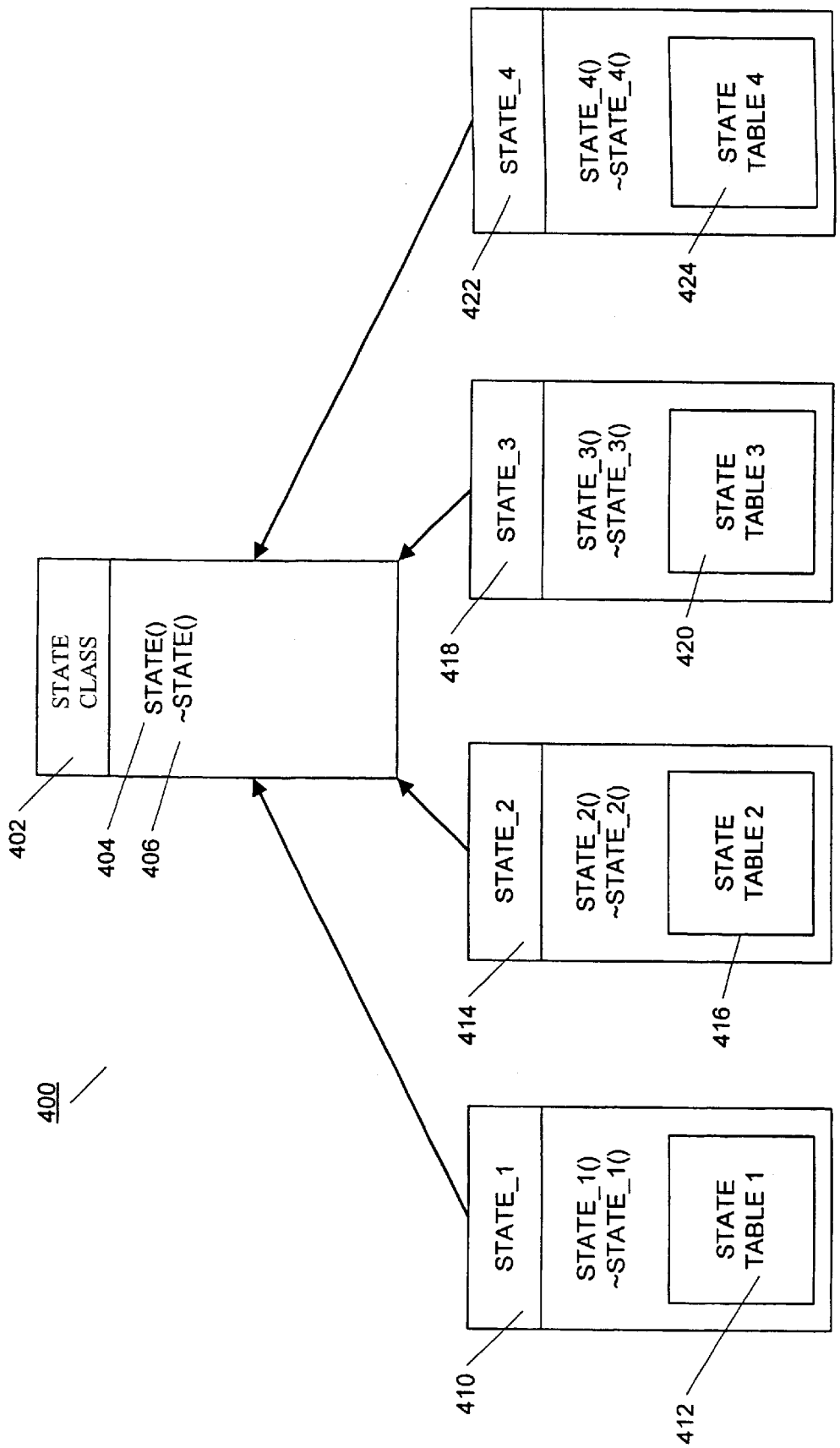
FIG. 4 is a class diagram illustrating a state class and subclasses representing a four-state process.

In accordance with the principles of the invention, a state object is instantiated, which encapsulates a portion of a complete state table that is associated with each state. FIG. 4 illustrates the classes 400 used to instantiate each state object. A base State class 402 contains the usual constructor 404 and destructor 406 and may contain other common functions (not shown.) The base State object 402 is shown with four subclasses 410, 414, 418 and 422 named State_1, State_2, State_3 and State_4, respectively. Each state subclass has an associated state table, 412, 416, 420 and 424 defined therein, respectively. In accordance with the invention, the state table defined in each class contains only the event and state transition information for the associated state as will be discussed in detail below. Each subclass 410, 414, 418 and 422 may be further subclassed in order to modify table entries and add additional entries, also as discussed below.

Figure 1:
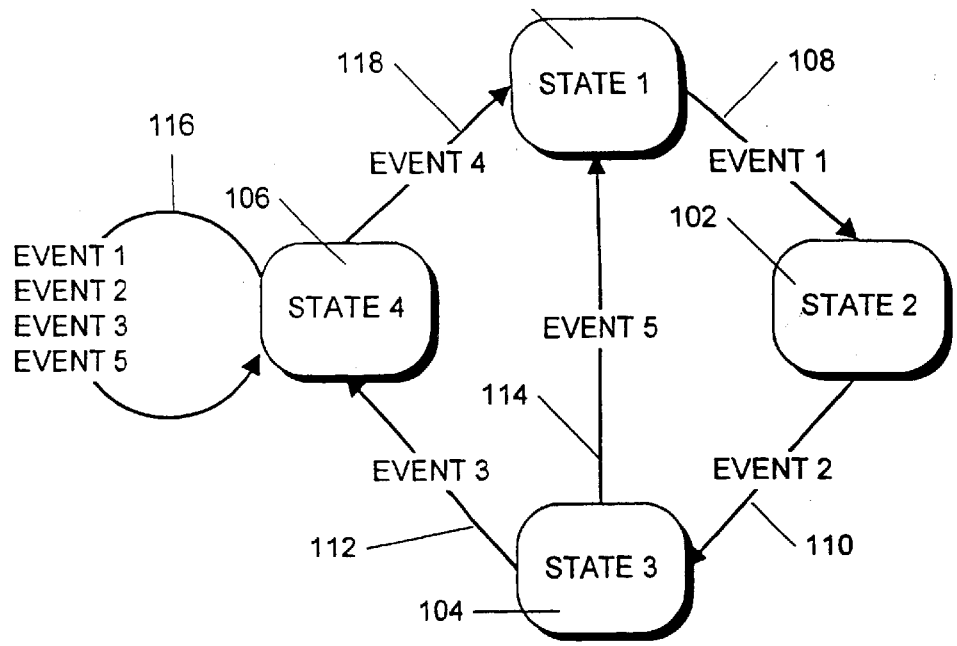
FIG. 1 is an illustration of a prior art state diagram for a four-state process.
Figure 5:
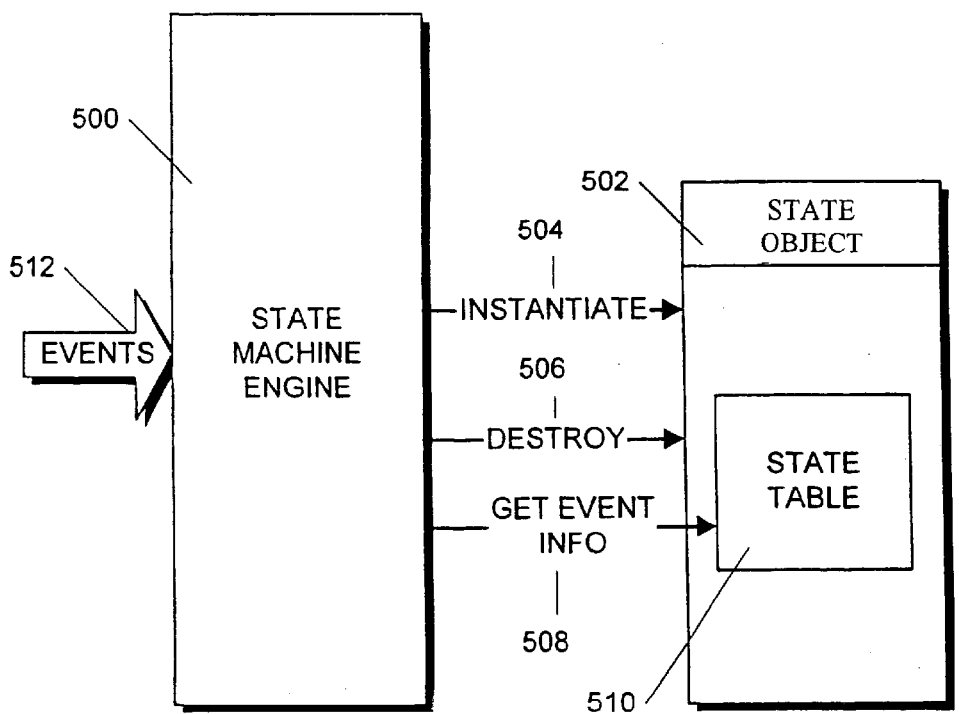
FIG. 5 is a schematic illustration of one implementation which uses a state machine engine to instantiate and destroy state objects as the state machine runs.
Figure 2:
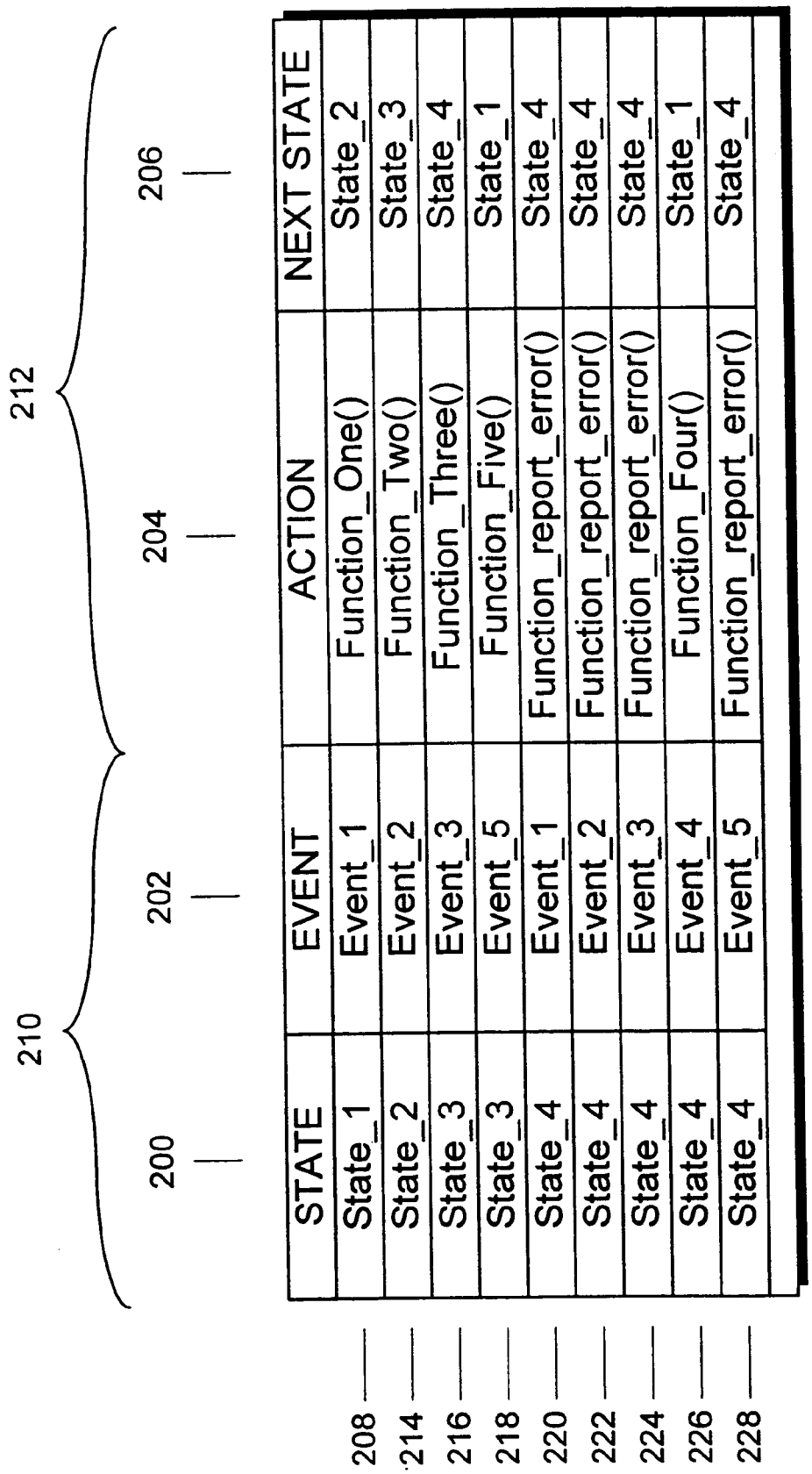
FIG. 2 is a conventional state table for the four-state process illustrated in FIG. 1.

The state classes operate with a state machine engine 500 as illustrated in FIG. 5. When a state is entered in response to an event received by state machine engine 500 as indicated by arrow 512, the engine 500 instantiates a state object 502 from the class associated with the state as schematically illustrated by arrow 504. When the appropriate object 502 is instantiated, the load function that operates during instantiation loads the data for state table 510. The state machine engine 500 can then retrieve the table information as illustrated by arrow 508. As previously mentioned this data is only the state table data associated with the state currently being entered. For example, FIG. 6 illustrates a sample state table 600 associated with state 1 of FIG. 1. Rows 602 of table 600 are the same as rows 302–310 of FIG. 3 and represent the response of the state machine to each of five events when the system is in state 1. The state table 600 consists of rows of events that are associated with the particular state that the associated state object represents. Each state-event row has either a member function to handle the event noted on that row, a transition to a new state, or both. The state table is stored as an array.

In addition, two new rows 604 and 606 have been added. These rows represent system events that are generated when the system enters and leaves state 1, respectively. These events are labeled 'Init_Event' and 'Term_Event'. The 'Init_Event' is generated by the system any time a state transition occurs to a new state. When this event occurs, a function Function_State_1_Init( ) can be executed in a conventional manner to perform "housekeeping" matters, such as memory or scope management, or to perform other operations. Likewise, the 'Term_Event' is generated when a state transition occurs out of the current state. This event allows operations such as memory or scope cleanup to be performed. For example, initially transitioning to 'State_1' generates the 'Init_Event' event, resulting in the optionally defined ACTION to be invoked, 'Function_State_1_Init( )'. The benefit of this approach is that now a function can be invoked upon transitioning to a new state that allows existing software machines to alter the scope and processing of events. A proven and well tested existing table driven state machine can thereby be extended with new capabilities in response to changing customer needs, new requirements, or the need to remain competitive. In addition, the management of scope allows developers to start multiple instances of state machines, state machines within state machines, with the option of sub-classing the tables, or inheritance.

Figures 7, 9:
FIG. 7 is a state table that might be used to override the state table of FIG. 6, for example, in a subclass.
FIG. 9 is an example of a state table abbreviated to save space.

The Function_State_1_Init( ) function allows the events that are recognized and the corresponding functions that get invoked to be overwritten. This technique allows a developer to subclass the existing table by loading a new table. Existing events that are redefined take on the new definitions, new events that were not previously defined can be added, the concept of scope with regard to references is supported for the current table and new sub-table, and the Init_Event function invoked for the new sub-table. The 'Init_Event' message is processed as defined by the table's optionally defined ACTION. For example, if an existing state table is defined as in FIG. 6, a new table shown in FIG. 7 could be loaded as the result of a subclass. Table 700 contains a new definition for events Event_1 and Event_2 in rows 702 and 704, respectively, and new events, Event_6 and Event_7 have been added in rows 706 and 708. The resulting composite table illustrated in FIG. 8 is formed. Note that rows 802 and 814 corresponding to the Init_Event and Term_Event remain the same as in FIG. 6. Rows 804 and 806 corresponding to Event_1 and Event_2 have been redefined and rows 808 remain the same. Rows 810 and 812 corresponding to new events Event_6 and Event_7 have been added.

Returning to FIG. 5, when a state is exited, the state machine engine 500 destroys the state object 502 as indicated by arrow 506. When the state object is destroyed, the memory used for the state table data 510 is released. In this manner, only memory necessary for the portion of a state table associated with the current state is in use at any given time. Since the whole state table is not loaded into memory, a considerable memory saving is recognized.

In order to save further memory, the first column of the state table that identifies the state can be omitted since the table portion refers to only one state. For example, instead of the table shown in FIG. 7, the table 900 shown in FIG. 9 could be loaded. Note that the first column 710, which refers only to State_1, has been omitted in table 900.

Figure 10A:
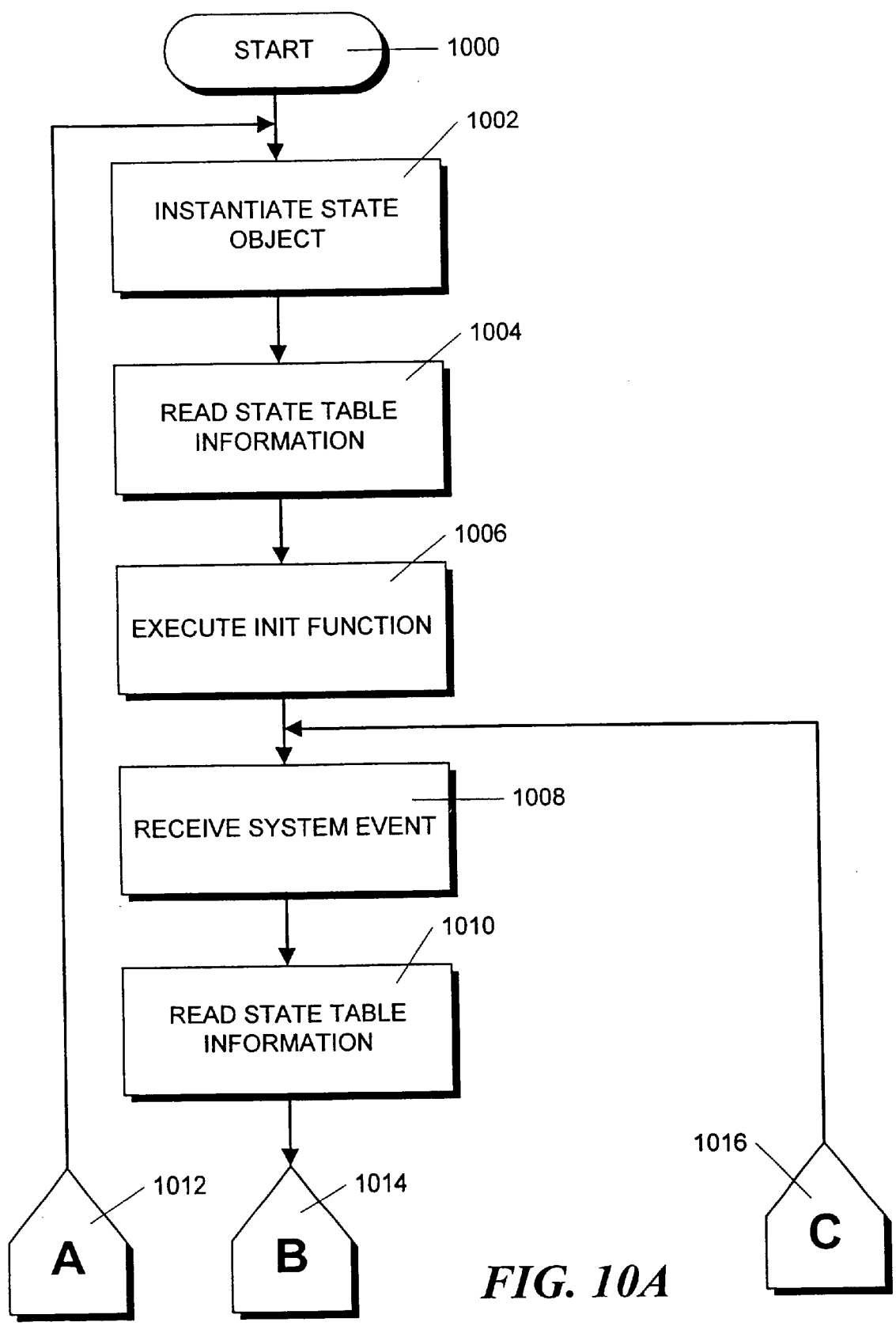
FIGS. 10A and 10B, when placed together form a flowchart illustrating the steps in an illustrative routine performed by the state machine engine shown in FIG. 5.
Figure 10B:
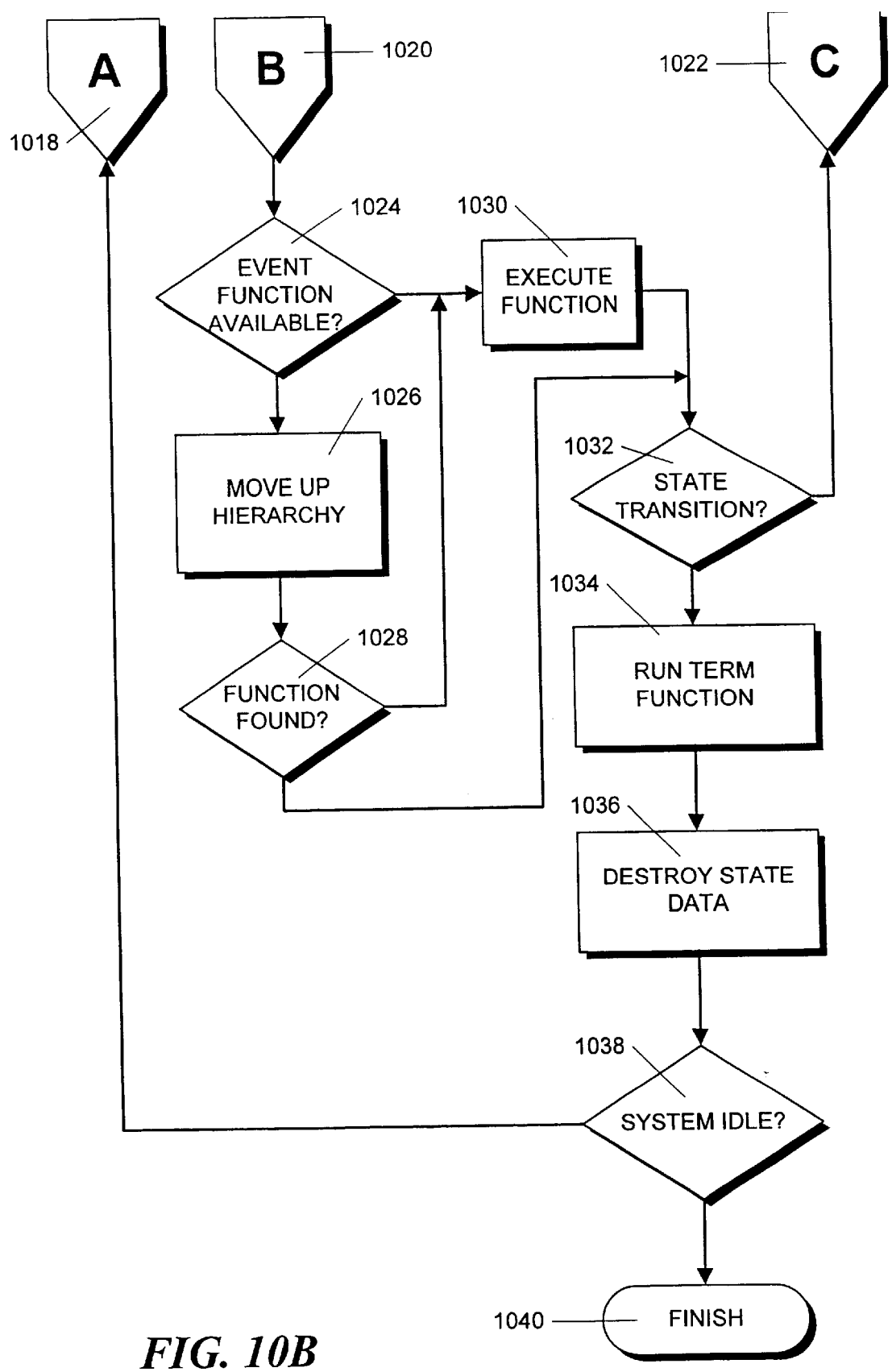

FIGS. 10A and 10B, when placed together, form a flowchart which illustrates the operation of the state machine engine 500. The state machine engine process starts in step 1000 and proceeds to step 1002, in which a state object is instantiated for the current state. If the state machine is just starting, normally, one state would be designated as a default state; thus a state object corresponding to this default state would be instantiated in step 1002. Next, the routine proceeds to step 1004 where the state table information contained in the instantiated state object is read. If the state table information contains an "Init" function, that function is executed in step 1006.

Next, the state machine engine waits in the current state for a system event to be received, as indicated in step 1008. When such system event is received, the state table information in the instantiated state object is again read in step 1010 to determine the appropriate action. The routine next proceeds, via off page connectors 1014 and 1020, to step 1024.

In step 1024, the information retrieved from the state table in step 1010 is examined to determine whether a function to handle the event is available in the current state table. If so, the routine proceeds to step 1030 where the function is executed and the routine proceeds to step 1032. Alternatively, if in step 1024, no event function is available to handle the event, the state machine engine examines any parent classes to determine whether a function is defined for that event in a parent class. If such a function is found, as indicated in step 1028, then the function is executed in step 1030. Alternatively, if no function is found in any of the parent classes of the hierarchy, the event is ignored and routine proceeds directly to step 1032.

In step 1032, the state table information read in step 1010 is examined to determine whether a state transition is to occur. If a state transition does not occur, then the routine proceeds, via off page connectors 1022 and 1016, back to step 1018 where the state machine engine waits to receive another system event. Operation proceeds in this manner until a state transition is indicated in step 1032.

If a state transition is indicated in step 1032, then the routine proceeds to step 1034 where the "Term" function is executed. Next, in step 1036, the state data is destroyed by destroying the state object.

In step 1038, the state machine engine checks to see whether the system is idle by examining the next state information in the state table information. If so, the routine finishes in step 1040. However, if the system is not idle, as determined in step 1038, the state machine engine proceeds, via off page connectors 1018 and 1012, back to step 1002 in which a new state object is instantiated for the new state. The operation continues then in the manner previously discussed.

Figure 13:
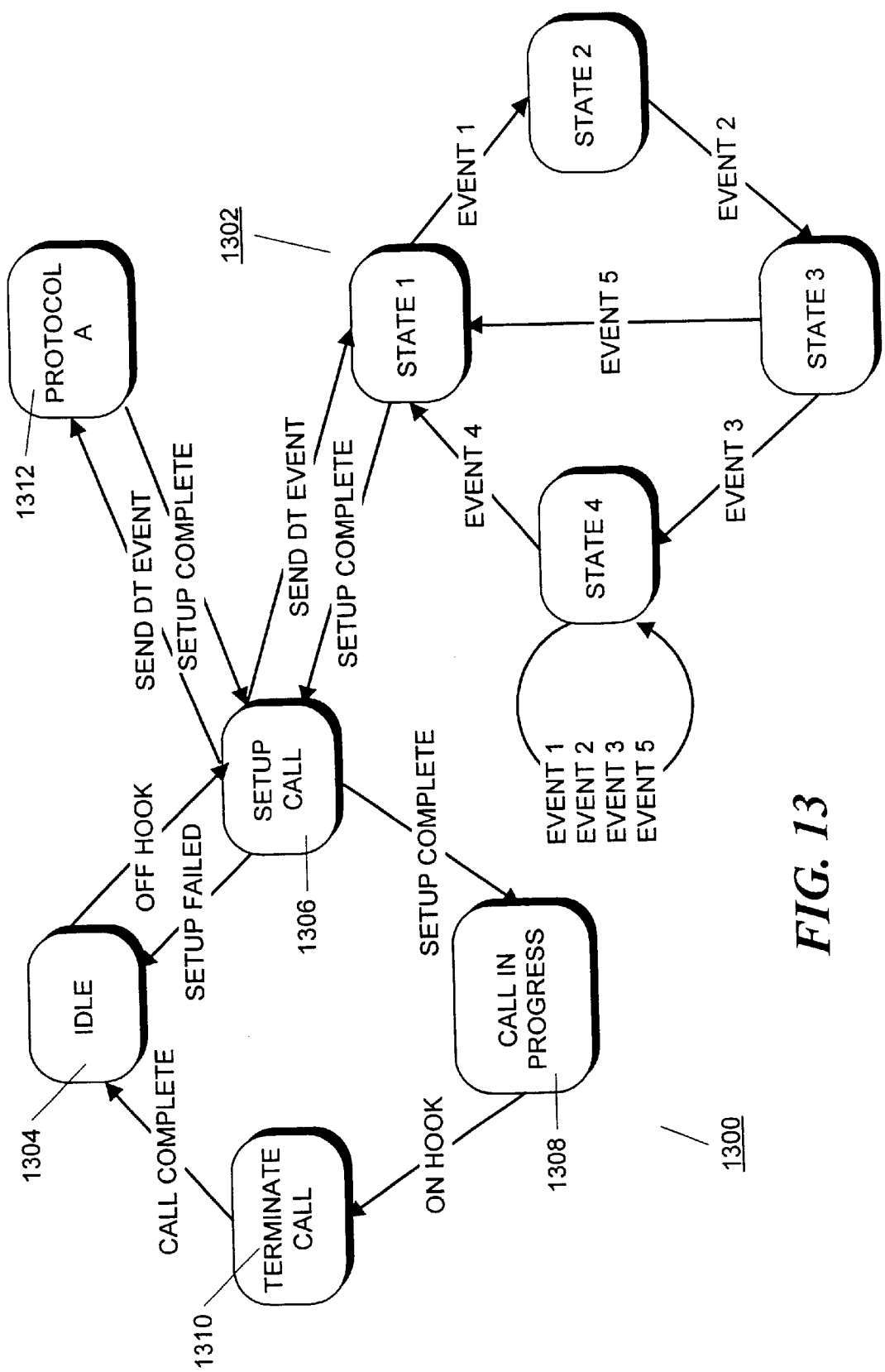
FIG. 13 is a state diagram for the telecommunications example in which the state tables shown in FIGS. 11 and 12 are used.

An example utilizing the principles of the invention is illustrated in FIGS. 11,12 and 13. FIGS. 11 and 12 are state tables for two states of a table driven state machine designated as TDSM-A. FIG. 13 is a state diagram for the whole system which consists of TDSM-A 1300 and a second state machine which, illustratively is the state machine shown in FIG. 1 and is designated as TDSM-B 1302.

TDSM-A 1300 normally rests in the "Idle" state 1304. FIG. 11 illustrates a state table 1100 for the idle state 1304. As mentioned above, this state table would be encapsulated in a state object which, in turn, would be instantiated when TDSM-A 1300 was in the idle state. As shown in rows 1102 and 1106, an "Init_Event" and a "Term_Event" have no "ACTION" or "NEXT STATE" associated with them. In row 1104, an "Off_Hook_Event" results in the state machine engine invoking an action defined by the Function_Authenticate Terminal( ), and the system progressing to the "Setup_Call" state. Therefore, once in the "Idle" state 1304, the system simply waits for an "Off_Hook_Event."

Once an "Off_Hook_Event" is received, in accordance with the principles of the invention, the "Idle" state object is destroyed and the memory used to store table 1100 is released. The state machine engine then instantiates a "Setup_Call" object, which thereupon loads the state table 1200 illustrated in FIG. 12.

In the "Setup_Call" state 1306, an "Init_Event" is processed from the information in row 1202, which results in the action "Function_Select_Protocol (Send_DT_Event)" being invoked. The "Function_Select_Protocol(Send_DT_Event)" function evaluates terminal and call attributes and creates a new instance of a table driven state machine TDSM-B 1302 (no table is shown) appropriate for a device represented by TDSM-B 1302. The "Function_Select_Protocol(Send_DT_Event)" function may or may not have overloaded the existing TDSM-B table with events that are to be returned by the newly created TDSM-B 1302. TDSM-B 1302 completes processing of the Init_Event, returning execution to TDSM-A 1300, and the action that created TDSM-B. The "Function_Select_Protocol(Send_DT_Event)" function then posts an event "Send_DT_Event" to TDSM-B 1302 as indicated by the arrow and waits for the next event.

TDSM-B 1302 processes the "Send_DT_Event" and may invoke some optional action. Eventually TDSM-B 1302 returns a "Setup Complete" event (which may be a "well known" event or an "overloaded event" as discussed earlier) back to TDSM-A 1300 as indicated by the arrow, resulting in continued execution.

After posting the "Setup Complete" event TDSM-B may execute a Term_Event which, for example, could result in all TDSM-B 1302 resources being freed. However, TDSM-B 1302 may continue execution indefinitely and terminate at a later instance or upon call completion. In addition, TDSM-A 1300 may, at any time, send a "Term Event" to TDSM-B 1302.

Alternatively, the "Send_DT_Event" event may be posted to a device represented by Protocol A 1312 that requires more complex interaction. In response, the "Send_

DT_Event" may result in the creation of a very complex Protocol A state machine 1312. However, upon completion, this latter complex state machine would return a "Setup Complete" event to TDSM-A 1300 as in the prior case. This approach allows very complex protocols to be simplified at the higher levels.

In response to the "Setup Complete" event posted by TDSM-B 1302, TDSM-A 1300 uses the state table 1200, and, in particular, the information in row 1204 to locate and execute the "Function_Send_Dial_Tone" function. TDSM-A 1300 then enters the "Call In Progress" state 1308. Again, in accordance with the principles of the invention, the "Setup Call" state object is destroyed and the memory used to store table 1200 is released. The state machine engine then instantiates a "Call In Progress" object which thereupon loads another state table (not shown).

Processing then continues in this manner. For example, an "On-Hook" event may be received causing the system to proceed from the "Call In Progress" state to the "Terminate Call" state 1310. The "Call In Progress" state object is destroyed and the memory used to store the related state table is released. The state machine engine then instantiates a "Terminate Call" object, which thereupon loads another state table (not shown). Finally, a "Call Complete" event returns the system to the "Idle" state 1304. The "Terminate Call" state object is destroyed and the memory used to store the related state table is released. The state machine engine then instantiates an "Idle" object, which thereupon loads state table 1100 illustrated in FIG. 11.

A software implementation of the above-described embodiment may comprise a series of computer instructions either fixed on a tangible medium, such as a computer readable media, e.g. diskette, CD-ROM, ROM, or fixed disk, or transmittable to a computer system, via a modem or other interface device, such as a communications adapter connected to a network over a medium. The medium can be either a tangible medium, including but not limited to optical or analog communications lines, or may be implemented with wireless techniques, including but not limited to microwave, infrared or other transmission techniques. It may also be the Internet. The series of computer instructions embodies all or part of the functionality previously described herein with respect to the invention. Those skilled in the art will appreciate that such computer instructions can be written in a number of programming languages for use with many computer architectures or operating systems. Further, such instructions may be stored using any memory technology, present or future, including, but not limited to, semiconductor, magnetic, optical or other memory devices, or transmitted using any communications technology, present or future, including but not limited to optical, infrared, microwave, or other transmission technologies. It is contemplated that such a computer program product may be distributed as a removable media with accompanying printed or electronic documentation, e.g., shrink wrapped software, pre-loaded with a computer system, e.g., on system ROM or fixed disk, or distributed from a server or electronic bulletin board over a network, e.g., the Internet or World Wide Web.

Although an exemplary embodiment of the invention has been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. Further, the methods of the invention may be achieved either in all software implementations, using the appropriate processor instructions, or in hybrid implementations that utilize a combination of hardware logic and software logic to achieve the same results. These, and other straightforward modifications to the inventive concept are intended to be covered by the appended claims.

What is claimed is:

1. A method for implementing a finite state machine having a plurality of states wherein the responses of the plurality of states to system events are defined by a state table, the method comprising:

(a) creating a state class associated with each state of the finite state machine, the state class encapsulating a portion of the state table, which portion defines the response of the associated state to system events;

(b) when a state is entered, instantiating a state object from the state class associated with the state so that memory is allocated for the encapsulated portion of the state table; and (c) when a state is exited, destroying the associated state object to release allocated memory.

2. The method of claim 1 wherein the portion of the state table comprises responses of the associated state to all system events.

3. The method of claim 1 wherein the portion of the state table includes at least one method which is run in response to a system event.

4. The method of claim 1 wherein the portion of the state table includes information identifying at least one state which is entered in response to a system event.

5. The method of claim 1 further comprising:

(d) creating a state subclass of a state class associated with a state of the finite state machine, the state subclass encapsulating a portion of the state table, which portion defines the response of the state associated with the state class to system events.

6. The method of claim 5 wherein step (b) comprises:

(b1) when a state is entered, instantiating a state object from the state sub class associated with the state so that the portion of the state table is a composite of the state table portion encapsulated in the state sub class and the state table portion encapsulated in the state class.

7. The method of claim 6 wherein the composite includes selected parts of the state table portion encapsulated in the state class which are not overwritten by the state table portion encapsulated in the state sub class and selected parts of the state table portion encapsulated in the state subclass which overwrite the state table portion encapsulated in the state class.

8. The method of claim 1 wherein the portion of the state table includes a method which is run when the associated state is entered.

9. The method of claim 8 wherein the method which is run when the associated state is entered redefines the portion of the state table encapsulated in the associated state object.

10. The method of claim 1 wherein the portion of the state table includes a method which is run when the associated state is exited.

11. Apparatus for implementing a finite state machine having a plurality of states wherein the responses of the plurality of states to system events are defined by a state table, the apparatus comprising:

a state class associated with each state of the finite state machine, the state class encapsulating a portion of the state table, which portion defines the response of the associated state to system events; and a state machine engine which responds to a state being entered by instantiating a state object from the state class associated with the state so that memory is allocated for the encapsulated portion of the state table and which responds to a state being exited by destroying the associated state object to release allocated memory.

12. The apparatus of claim 11 wherein the portion of the state table comprises responses of the associated state to all system events.

13. The apparatus of claim 11 wherein the portion of the state table includes at least one method which is run in response to a system event.

14. The apparatus of claim 11 wherein the portion of the state table includes information identifying at least one state which is entered in response to a system event.

15. The apparatus of claim 11 further comprising:
a state subclass of a state class associated with a state of the finite state machine, the state subclass encapsulating a portion of the state table, which portion defines the response of the state associated with the state class to system events.

16. The apparatus of claim 15 wherein the state machine engine responds to a state being entered by instantiating a state object from the state subclass associated with the state so that the portion of the state table is a composite of the state table portion encapsulated in the state subclass and the state table portion encapsulated in the state class.

17. The apparatus of claim 16 wherein the composite includes selected parts of the state table portion encapsulated in the state class which are not overwritten by the state table portion encapsulated in the state sub class and selected parts of the state table portion encapsulated in the state subclass which overwrite the state table portion encapsulated in the state class.

18. The apparatus of claim 11 wherein the portion of the state table includes a method which is run when the associated state is entered.

19. The apparatus of claim 18 wherein the method which is run when the associated state is entered can redefine the portion of the state table encapsulated in the associated state object.

20. The apparatus of claim 11 wherein the portion of the state table includes a method which is run when the associated state is exited.

21. A computer program product for implementing a finite state machine having a plurality of states wherein the responses of the plurality of states to system events are defined by a state table, the computer program product comprising a computer usable media, having computer readable program code thereon, including:
a state class associated with each state of the finite state machine, the state class encapsulating a portion of the state table, which portion defines the response of the associated state to system events;
program code, operable when a state is entered, for instantiating a state object from the state class associated with the state so that memory is allocated for the encapsulated portion of the state table; and
program code, operable when a state is exited, for destroying the associated state object to release allocated memory.

22. The computer program product of claim 21 wherein the portion of the state table comprises responses of the associated state to all system events.

23. The computer program product of claim 21 wherein the portion of the state table includes at least one method which is run in response to a system event.

24. The computer program product of claim 21 wherein the portion of the state table includes information identifying at least one state which is entered in response to a system event.

25. The computer program product of claim 21 further comprising a state subclass of a state class associated with a state of the finite state machine, the state subclass encapsulating a portion of the state table, which portion defines the response of the state associated with the state class to system events.

26. The computer program product of claim 25 wherein the state machine engine is operable when a state is entered for instantiating a state object from the state sub class associated with the state so that the portion of the state table is a composite of the state table portion encapsulated in the state sub class and the state table portion encapsulated in the state class.

27. The computer program product of claim 26 wherein the composite includes selected parts of the state table portion encapsulated in the state class which are not overwritten by the state table portion encapsulated in the state sub class and selected parts of the state table portion encapsulated in the state subclass which overwrite the state table portion encapsulated in the state class.

28. The computer program product of claim 21 wherein the portion of the state table includes a method which is run when the associated state is entered.

29. The computer program product of claim 28 wherein the method which is run when the associated state is entered can redefine the portion of the state table encapsulated in the associated state object.

30. The computer program product of claim 21 wherein the portion of the state table includes a method which is run when the associated state is exited.

31. A computer data signal embodied in a carrier wave for implementing a finite state machine having a plurality of states wherein the responses of the plurality of states to system events are defined by a state table, the computer data signal comprising:
a state class associated with each state of the finite state machine, the state class encapsulating a portion of the state table, which portion defines the response of the associated state to system events;
program code, operable when a state is entered, for instantiating a state object from the state class associated with the state so that memory is allocated for the encapsulated portion of the state table; and
program code, operable when a state is exited, for destroying the associated state object to release allocated memory.

32. The computer data signal of claim 31 wherein the portion of the state table comprises responses of the associated state to all system events.

33. The computer data signal of claim 31 wherein the portion of the state table includes at least one method which is run in response to a system event.

34. The computer data signal of claim 31 wherein the portion of the state table includes information identifying at least one state which is entered in response to a system event.

35. The computer data signal of claim 31 further comprising a state subclass of a state class associated with a state of the finite state machine, the state subclass encapsulating a portion of the state table, which portion defines the response of the state associated with the state class to system events.

36. The computer data signal of claim 35 wherein the state machine engine is operable when a state is entered for instantiating a state object from the state sub class associated with the state so that the portion of the state table is a composite of the state table portion encapsulated in the state sub class and the state table portion encapsulated in the state class.

37. The computer data signal of claim 36 wherein the composite includes selected parts of the state table portion encapsulated in the state class which are not overwritten by the state table portion encapsulated in the state sub class and selected parts of the state table portion encapsulated in the state subclass which overwrite the state table portion encapsulated in the state class.

38. The computer data signal of claim 31 wherein the portion of the state table includes a method which is run when the associated state is entered.

39. The computer data signal of claim 38 wherein the method which is run when the associated state is entered can redefine the portion of the state table encapsulated in the associated state object.

40. The computer data signal of claim 31 wherein the portion of the state table includes a method which is run when the associated state is exited.

* * * * *